(12) United States Patent
Basler et al.

(10) Patent No.: US 10,734,250 B2
(45) Date of Patent: Aug. 4, 2020

(54) METHOD OF MANUFACTURING A PACKAGE HAVING A POWER SEMICONDUCTOR CHIP

(71) Applicant: Infineon Technologies Austria AG, Villach (AT)

(72) Inventors: Thomas Basler, Riemerling (DE); Edward Fuergut, Dasing (DE); Christian Kasztelan, Munich (DE); Ralf Otremba, Kaufbeuren (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/293,246

(22) Filed: Mar. 5, 2019

(65) Prior Publication Data

US 2019/0198355 A1    Jun. 27, 2019

Related U.S. Application Data

(60) Continuation of application No. 15/829,592, filed on Dec. 1, 2017, now Pat. No. 10,256,119, which is a
(Continued)

(30) Foreign Application Priority Data

Jun. 2, 2015   (DE) .................. 10 2015 108 700

(51) Int. Cl.
*H01L 21/50* (2006.01)
*H01L 21/56* (2006.01)
(Continued)

(52) U.S. Cl.
CPC ............ *H01L 21/565* (2013.01); *H01L 23/24* (2013.01); *H01L 23/36* (2013.01);
(Continued)

(58) Field of Classification Search
CPC ....... H01L 21/565; H01L 23/24; H01L 23/37; H01L 23/36; H01L 23/3737;
(Continued)

(56) References Cited

U.S. PATENT DOCUMENTS 6,060,729 A    5/2000  Suzuki et al.
6,559,525 B2   5/2003  Huang
(Continued)

FOREIGN PATENT DOCUMENTS

EP    1703557 A2    9/2006
EP    2804209 A1   11/2014
(Continued)

*Primary Examiner* — Luan C Thai
(74) *Attorney, Agent, or Firm* — Murphy, Bilak & Homiller, PLLC

(57) ABSTRACT

A method of manufacturing a semiconductor power package includes: embedding a power semiconductor chip in an encapsulation, the encapsulation forming a housing of the semiconductor power package; and extending a layer of a covering material over at least a part of an outer main surface of the encapsulation. The covering material has a thermal conductivity greater than a thermal conductivity of the material of the encapsulation and/or a temperature stability greater than a temperature stability of the pre-molded chip housing.

21 Claims, 5 Drawing Sheets

Related U.S. Application Data division of application No. 15/170,175, filed on Jun. 1, 2016, now Pat. No. 9,837,288.

(51) Int. Cl.

| | |
|---|---|
| *H01L 23/00* | (2006.01) |
| *H01L 25/07* | (2006.01) |
| *H01L 23/36* | (2006.01) |
| *H01L 23/373* | (2006.01) |
| *H01L 23/40* | (2006.01) |
| *H01L 23/495* | (2006.01) |
| *H01L 23/498* | (2006.01) |
| *H01L 23/24* | (2006.01) |

(52) U.S. Cl.
CPC ...... *H01L 23/3737* (2013.01); *H01L 23/4006* (2013.01); *H01L 23/49524* (2013.01); *H01L 23/49562* (2013.01); *H01L 23/49861* (2013.01); *H01L 24/37* (2013.01); *H01L 24/40* (2013.01); *H01L 24/48* (2013.01); *H01L 24/73* (2013.01); *H01L 25/074* (2013.01); *H01L 23/4093* (2013.01); *H01L 24/29* (2013.01); *H01L 24/32* (2013.01); *H01L 2224/293* (2013.01); *H01L 2224/29294* (2013.01); *H01L 2224/32227* (2013.01); *H01L 2224/32245* (2013.01); *H01L 2224/37013* (2013.01); *H01L 2224/401* (2013.01); *H01L 2224/40227* (2013.01); *H01L 2224/40247* (2013.01); *H01L 2224/45099* (2013.01); *H01L 2224/4846* (2013.01); *H01L 2224/48227* (2013.01); *H01L 2224/48247* (2013.01); *H01L 2224/73221* (2013.01); *H01L 2224/73263* (2013.01); *H01L 2224/73265* (2013.01); *H01L 2224/8384* (2013.01); *H01L 2224/83825* (2013.01); *H01L 2225/06589* (2013.01); *H01L 2924/00014* (2013.01); *H01L 2924/13055* (2013.01); *H01L 2924/13091* (2013.01); *H01L 2924/181* (2013.01)

(58) Field of Classification Search
CPC ......... H01L 23/49524; H01L 23/49562; H01L 23/49861; H01L 24/48; H01L 24/40; H01L 24/37
USPC ........................................................ 438/122
See application file for complete search history.

(56) References Cited

U.S. PATENT DOCUMENTS

| | | | |
|---|---|---|---|
| 6,703,703 | B2 | 3/2004 | Grant |
| 6,703,707 | B1 | 3/2004 | Mamitsu et al. |
| 6,809,342 | B2 | 10/2004 | Harada |
| 6,960,878 | B2 | 11/2005 | Sakano et al. |
| 7,078,732 | B1 | 7/2006 | Reeh et al. |
| 7,342,357 | B2 | 3/2008 | Sakano et al. |
| 7,508,129 | B2 | 3/2009 | Watanabe et al. |
| 8,377,725 | B2 | 2/2013 | Fujitomo et al. |
| 8,409,918 | B2 * | 4/2013 | Yang ................. H01L 24/97 257/678 |
| 8,723,310 | B2 * | 5/2014 | Park ................. H01L 23/3135 257/669 |
| 9,059,145 | B2 | 6/2015 | Kadoguchi et al. |
| 2001/0030362 | A1 | 10/2001 | Grant |
| 2001/0045644 | A1 | 11/2001 | Huang |
| 2002/0177258 | A1 | 11/2002 | Hembree |
| 2005/0280127 | A1 | 12/2005 | Zhao et al. |
| 2005/0280139 | A1 | 12/2005 | Zhao et al. |
| 2007/0273019 | A1 * | 11/2007 | Huang ................. H01L 21/561 257/690 |
| 2009/0174044 | A1 | 7/2009 | Eom et al. |
| 2012/0098117 | A1 | 4/2012 | Sato et al. |
| 2015/0061108 | A1 | 3/2015 | Tong |

FOREIGN PATENT DOCUMENTS

| | | |
|---|---|---|
| FR | 2570383 A1 | 3/1986 |
| WO | 2014069353 A1 | 5/2014 |

\* cited by examiner

METHOD OF MANUFACTURING A PACKAGE HAVING A POWER SEMICONDUCTOR CHIP

TECHNICAL FIELD

This invention relates to the technique of packaging, and in particular to the technique of integrating a power semiconductor chip into a package.

BACKGROUND

Power semiconductor device manufacturers are constantly striving to increase the performance of their products, while decreasing their cost of manufacture. A cost intensive area in the manufacture of power semiconductor devices is packaging the power semiconductor chip. Performance of a power semiconductor device is dependent from the heat dissipation capability provided by the package. Low cost devices of high thermal robustness, improved heat dissipation capability and increased reliability and electrical performance are desirable.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and, together with the description, serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
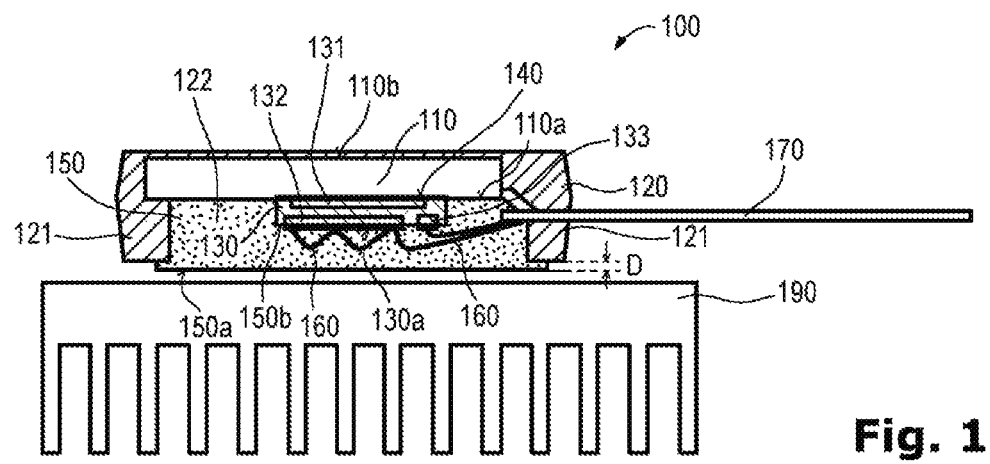
FIG. 1 schematically illustrates a cross-sectional view of an exemplary leaded semiconductor power package including a soft covering material embedding the power semiconductor chip.

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other unless specifically noted otherwise.

Further, as employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the words "over" or "above" used with regard to a part, element or material layer formed or located "over" or "above" a surface may be used herein to mean that the part, element or material layer be located (e.g. placed, formed, deposited, etc.) "directly on", e.g. in direct contact with, the implied surface. The words "over" or "above" used with regard to a part, element or material layer formed or located "over" or "above" a surface may be used herein to mean that the part, element or material layer be located (e.g. placed, formed, deposited, etc.) "indirectly on" the implied surface with one or more additional parts, elements or layers being arranged between the implied surface and the part, element or material layer. The same applies analogously to the terms or "under", "below", "beneath", etc.

The semiconductor power packages described herein contain one or more power semiconductor chip(s). This or these power semiconductor chip(s) may be of different types and may be manufactured by different technologies. They include (monolithic) power integrated circuits and may further include, for example, logic integrated circuits, analogue integrated circuits, mixed signal integrated circuits, memory circuits, or sensors. The power semiconductor chip(s) referred to herein may be manufactured from specific semiconductor material such as, for example, Si, SiC, SiGe, GaAs, GaN, AlGaN, InGaAs, InAlAs, etc., and, furthermore, may contain inorganic and/or organic materials that are not semiconductors.

The power semiconductor chip(s) referred to herein may, e.g., be power switches, power transistors, power diodes, etc. They may additionally include control circuits, microprocessors, memory circuits and/or sensors.

The power semiconductor chip(s) referred to herein may, for example, be configured as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g., a PIN diode or a Schottky diode.

The power semiconductor chip(s) referred to herein may, e.g., have a vertical structure, that is to say that the semiconductor chip(s) may be fabricated in such a way that electric currents can flow in a direction perpendicular to the main surfaces of the semiconductor chip(s). A power semiconductor chip having a vertical structure has electrodes on its two main surfaces, that is to say on its top and bottom side surfaces.

The power semiconductor chip(s) referred to herein may have a horizontal structure. A power semiconductor chip having a horizontal structure often has chip electrodes only on one of its two main surfaces, e.g., on its active surface. The opposite main surface may typically be the mounting surface of the power semiconductor chip.

The semiconductor power package may comprise a pre-molded chip housing and an electrically conducting chip carrier cast-in-place in the pre-molded chip housing.

The pre-molded chip housing may be made of mold material such as, e.g., an electrically insulating thermoset material or a thermoplastic material. More specifically, the mold material may comprise or be at least one of a filled or unfilled mold material, a filled or unfilled thermoplastic material, or a filled or unfilled thermoset material. A thermoset material may, e.g., be made on the basis of an epoxy resin or an acrylic resin. A thermoplastic material may, e.g., comprise one or more materials selected from the group of polyetherimide (PEI), polyether-sulfone (PES), polyphenylene-sulfide (PPS), polyamide-imide (PAI), and polyethylene-terephthalate (PET). Thermoplastic materials melt by application of pressure and heat during molding and (reversibly) harden upon cooling and pressure release. Resin types of the mold material may include, e.g., cyanate ester, BMI (bismaleimide), epoxy-polyimide, epoxy-silicone, epoxy, silicone (hard type). Filler materials may include, e.g., $SiO_2$, $Al_2O_3$, BrN, AlN, etc.

Various techniques such as, e.g., transfer molding, compression molding, transfer and compression molding (both using, e.g. pellets, granulate, liquid or sheets, etc.), injection molding may be used to form the pre-molded chip housing, wherein all these techniques may employ film-assisted molding (FAM), in particular top and/or bottom side FAM, and/or vacuum molding. The mold material may be applied to cast-in-place an electrically conducting chip carrier.

The chip carrier may comprise one or multiple metal plates such as, e.g., one or more die pads and/or terminal pads of, e.g., a leadframe. The die metal plates may serve as chip carrier(s), e.g. chip pad(s). The metal plates may be made of any metal or metal alloy, e.g. copper or molybdenum or copper alloy or molybdenum alloy or composites thereof. In particular, molybdenum-based metal plates may provide for high reliability and reduced CTE (coefficient of thermal expansion) mismatch. The metal plates itself (e.g. their bottom faces) or leads protruding from the metal plates may be exposed by the pre-molded chip housing and may serve as outer terminals of the semiconductor power package (i.e. as package terminals).

By way of example, such electrically conducting chip carrier may be a leaded chip carrier having leads protruding out of the pre-molded chip housing and forming external terminals. By way of example, such leaded chip carrier may be a PLCC (Plastic Leaded Chip Carrier) or QFJ (Quad-Flat-J-Leaded) chip carrier. Leads may protrude out of the pre-molded chip housing at only one side of the housing or at a plurality of sides thereof, e.g. at two opposite sides (e.g. an IPM—intelligent power module—may comprise leads protruding out of the pre-molded chip housing at two opposite sides thereof). The chip carrier may also be a leadless chip carrier such as, e.g., a so-called TSLP—(Thin Small Leadless Package—) carrier. Examples for leadless packages/chip carriers configured as SMDs (Surface Mounted Devices) are, e.g., QFN (Quad-Flat-No-Leads), S0 (Small-Outline), e.g., SO8 (Small-Outline 8 Pins), SSO (Stacked SO), e.g., SSO8 (Stacked SO 8 Pins) and TOLL (TO Leadless). The pre-molded chip housing may comprise a MID (molded interconnect device) optionally including an MID connector.

In some embodiments, the chip carrier may comprise a plate of ceramics coated with a structured metal layer, e.g. a metal bonded ceramics substrate. By way of example, the chip carrier may be a DCB (direct copper bonded) ceramics substrate. It is also possible that the chip carrier may comprise or be a PCB (printed circuit board). The chip carrier may, e.g., comprise one or a plurality of MIS (molded interconnect substrate), such as, e.g. molded interconnect ceramic interposer(s) or molded interconnect leadframe(s). The chip carrier may, e.g., comprise an IMS (isolated metal substrate).

The semiconductor power packages described herein may further include one or more additional electronic components. The electronic component(s) may, e.g., also be mounted on the conducting chip carrier. The electronic component(s) may be designed as passive or active components. A passive component may, e.g., be a resistor, a capacitor, an inductor, a clock, and/or an integrated passive device (PID). An active component may, e.g., be a logic semiconductor chip, a memory semiconductor chip, a driver semiconductor chip to drive one or more of the power semiconductor chips, a level shifter, and a microcontroller chip, or a sensor. In contrast to the power semiconductor chip(s), the electronic components may not be embedded in the covering material. As such, it is possible that the electronic components may be molded into the pre-molded chip housing, while the power semiconductor chip(s) is (are) accommodated in the cavity (cavities) of the pre-molded chip housing.

A variety of different types of semiconductor power packages forming discrete power modules may be designed in accordance with the disclosure herein. In particular, a semiconductor power package described herein may be an individual molded package (having a single cavity) or a MAP (molded array package) having an array of cavities. By way of example, a semiconductor power package as disclosed herein may optionally comprise two or more power semiconductor chips such as, e.g., MISFETs, MOSFETs, or HEMTs embedded in the circuit board and, e.g., a logic integrated circuit as the (optional) electronic component embedded in the circuit board. The power semiconductor chips may, e.g., be connected in series, in parallel or may be electrically isolated from each other. For instance, a semiconductor power package disclosed herein may comprise a half-bridge circuit including a high side transistor, a low side transistor and, optionally, a logic integrated circuit chip serving as, e.g., a transistor gate driver. Further, the semiconductor power package disclosed herein may comprise a full-bridge such as, e.g., a B6 circuit including, e.g., 6 power transistors and (optionally) a logic integrated circuit chip serving as, e.g., a power transistor gate driver. Further, a semiconductor power package described herein may comprise a sensor chip and may provide for sensor chip current and/or temperature measurement.

Such semiconductor power module packages, in particular half-bridge or full-bridge circuits as disclosed herein, may, e.g., be implemented in an electronic circuit constituting a power supply, a voltage converter, a rectifier, a PFC (power factor correction) circuit, etc. By way of example, a voltage converter may be configured for converting DC or AC voltages into DC voltages, so-called DC-DC converters and AC-DC converters, respectively. DC-DC converters may be used to convert a DC input voltage provided by a battery or rechargeable battery into a DC output voltage matched to the demands of electronic circuits connected downstream. A DC-DC converter described herein may, e.g., be a buck converter or a boost-converter. AC-DC converters may be used to convert an AC input voltage provided by, e.g., a high voltage AC power network into a DC output voltage matched to the demands of electronic circuits connected downstream.

FIG. 1 illustrates an exemplary semiconductor power package 100. The semiconductor power package 100 includes an electrically conducting chip carrier 110, a pre-molded chip housing 120 and a power semiconductor chip 130 bonded over or on the electrically conducting chip carrier 110.

The electrically conducting chip carrier 110 may be a cast-in part of the pre-molded chip housing 120. That is, the electrically conducting chip carrier 110 may be used as an insert during molding of the pre-molded chip housing 120 resulting in that the electrically conducting chip carrier 110 is firmly and permanently positioned in the pre-molded chip housing 120. It is possible to not only cast-in-place the electrically conducting chip carrier 110 into the pre-molded chip housing 120, but to also integrate non-power components (not shown) such as, for example, passive components or logic integrated circuits, in the pre-molded chip housing 120.

The pre-molded chip housing 120 may comprise frame-like side walls 121. The frame-like side walls 121 may define and enclose (in a lateral dimension) a cavity 122. The bottom of the cavity 122 may be formed by a portion of a first surface 110a of the electrically conducting chip carrier 110.

The portion of the first surface 110a of the chip carrier 110 may be exposed by the material of the pre-molded chip housing 120. The exposed portion of the first surface 110a of the chip carrier 110 may serve as a chip pad or mounting platform for die attach, i.e. for bonding the power semiconductor chip 130 onto the electrically conducting chip carrier 110. By way of example, the first surface 110a of the chip carrier 110 may be metallic and a bonding layer 140 of, for example, a solder material, a sinter material, etc., of, for example, AuSn, AgSn, CuSn, AgIn, AuIn, AuGe, CuIn, AuSi, Sn, Au or other materials may be used to bond the power semiconductor chip 130 to the first surface 110a of the chip carrier 110.

A diffusion solder bond, a soft solder bond, a hard solder bond, a sintered metal bond and/or an electrically conducting adhesive bond may be used to form the bonding layer 140. In particular, the bonding layer may be made of a material which allows for low-temperature connectivity, that is, for example, an electrically conducting paste containing metal particles distributed in an organic material (so-called nano-paste). Such conducting paste may be used to generate an electrically conducting sintered bonding layer or an electrically conducting adhesive bonding layer by applying low temperature processes for sintering and/or curing the bonding material. The bonding layer 140 may be covered by the covering material 150 where not connected to the chip carrier 110 and/or the power semiconductor chip 130. Thus, the covering material 150 may completely seal the bonding connection between the chip carrier 110 and/or the power semiconductor chip 130.

The cavity 122 is at least partially or completely filled by a covering material 150. The covering material 150 embeds the power semiconductor chip 130. That is, a first surface 130a of the power semiconductor chip 130 may be completely covered and/or embedded in the covering material 150. Further, the side faces of the power semiconductor chip 130 may be partly or fully covered and/or embedded in the covering material 150. If a plurality of power semiconductor chips 130 are arranged side-by-side in the cavity 122, the same as described above for the power semiconductor chip 130 may apply for all of the semiconductor power chips accommodated in the cavity 122.

The covering material 150 may have an elastic modulus (E-modulus) less than the elastic modulus of the material of the pre-molded chip housing 120. Further, the covering material 150 may have a thermal conductivity greater than the thermal conductivity of the material of the pre-molded chip housing 120. As will be explained in more detail further below, each of these properties significantly improves heat removal from the power semiconductor chip 130. Effective heat removal is important for semiconductor power packages 100, as the performance and/or the usability of the semiconductor power package 100 greatly depends on the effectiveness of heat removal or heat dissipation as allowed or promoted by the semiconductor power package design. Thus, the covering material 150 may enable a small thermal resistance path between junction (j) and heat sink (hs), i.e. a small value of $Rth_{j-hs}$. Further, a small elastic modulus reduces stress acting on the power semiconductor chip 130 and on any package-internal connection elements. Further, the covering material may have a temperature stability higher than the temperature stability of the material of the pre-molded chip housing 120.

The covering material 150 may, e.g., be selected from the group consisting of a silicone-based material, a rubber-based material and a low TG (glass transition temperature) epoxy-based material. Such materials are typically softer and/or have a higher thermal conductivity and/or higher thermal capacity than materials conventionally used for molded chip packages. The covering material may be selected such that it does not undergo a phase transition over the entire operation conditions of the power semiconductor chip 130.

The covering material 150 may comprise a filler material to enhance its thermal conductivity and/or its thermal capacity. The mass percentage of the filler material content of the covering material may be equal to or greater than 85%, 90%, or 92%. The filler material may, for example, comprise or be of ceramic particles such as, for example, aluminum oxide, boron nitride, aluminum nitride, etc.

The covering material 150 may have an elastic modulus equal to or less than 10 GPa, 5 GPa, 2 GPa, 1 GPa, or 500 MPa. On the other hand, the elastic modulus of the material of the pre-molded chip housing 120 may, e.g., be equal to or greater than 10 GPa, 15 GPa, or 20 GPa.

The covering material 150 may have a thermal conductivity equal to or greater than 3 W/mK, 5 W/mK, 8 W/mK, 10 W/mK, 12 W/mK, 14 W/mK, 16 W/mK, 18 W/mK, or 20 W/mK. On the other hand, the thermal conductivity of the material of the pre-molded chip housing 120 may, e.g., be equal to or less than 12 W/mK, 10 W/mK, 8 W/mK, or 6 W/mK.

Covering materials 150 having one or more of the above-described properties are more expensive than conventional mold materials of which the pre-molded chip housing 120 may be formed. Therefore, it may be considered to be one concept of various embodiments described herein to apply the (more expensive) covering material only to portions of the semiconductor power package 100 where highly effective heat dissipation is of crucial importance.

As such, since in many power semiconductor chips 130 the main heat generation occurs at the first surface 130*a* of the power semiconductor chip 130, the covering material 150 may cover, e.g., at least the complete first surface 130*a* of the power semiconductor chip 130. Covering, in this context, may mean that the covering material fully and continuously extends in a lateral dimension over an area given by a vertical projection of the outline of the power semiconductor chip 130. Covering, in this context, may also mean that the first surface 130*a* of the power semiconductor chip 130, where not bonded to an (optional) electrical connection element such as, for example, a wire bond or a clip or a ribbon, is in direct contact to the first surface 130*a* of the semiconductor chip 130 and/or at least partly or completely encases the connection element.

By way of example, without loss of generality, the power semiconductor chip 130 may, e.g., be configured as a power transistor, for example, a power MOSFET, IGBT, JFET or power bipolar transistor, or a power diode. In the case of a power MOSFET or a JFET, a first load electrode 131 may, e.g., be a drain electrode, a second load electrode 132 may, e.g., be a source electrode, and a third electrode 133 may, e.g., be a gate electrode. In the case of an IGBT, the first load electrode 131 may be a collector electrode, the second load electrode 132 may be an emitter electrode, and the third electrode 133 may be a gate electrode. In the case of a power bipolar transistor, the first load electrode 131 may be a collector electrode, the second load electrode 132 may, e.g., be an emitter electrode, and the third electrode 133 may, e.g., be a base electrode. In the case of a power diode, first and second load electrodes 131, 132 are anode and cathode, respectively, and there is no third electrode. During operation, voltages higher than 5 V, 50 V, 100 V, 500 V or 1000 V may be applied between the first and second load electrodes 131, 132. A switching frequency applied to the third electrode (not shown) may be in the range from 100 Hz to 100 MHz, but may also be outside of this range.

By way of example, FIG. 1 illustrates a chip electrode (e.g. second load electrode 132) located at the first surface 130*a* of the power semiconductor chip 130 to be bonded by wire bonds 160 to a lead 170 forming an external terminal of the semiconductor power package 100. As illustrated by way of example in FIG. 1, the wire bonds 160 may be partly or completely encased by the covering material 150.

The covering material 150 may thus have an inner surface 150*b* facing (and optionally contacting) the power semiconductor chip 130 and a first outer surface 150*a* forming an exposed surface of the semiconductor power package 100.

This first outer surface 150*a* may provide for an interface to effectively remove heat from the semiconductor power package 100. The area size of the first outer surface 150*a* of the covering material 150 may be equal to or greater than 30%, 40%, 50%, 60%, 70%, 80%, 90%, or 95% of an area size of the corresponding surface of the semiconductor power package 100 (e.g. in FIG. 1 the face-down oriented top surface of the semiconductor power package 100). The greater the area size of the first outer surface 150*a*, the more efficient is the heat removal via this interface.

The first outer surface 150*a* may extend in a plane which is elevated by a certain distance D over an upper rim of the frame-like side walls 121 of the cavity 122 formed in the pre-molded chip housing 120. The distance D guarantees that a heat sink 190, which may be pressed and/or fixed onto the first outer surface 150*a* of the covering material 150, may compress the covering material 150 to enhance the thermal conductivity of the interface between the heat sink 190 and the covering material 150. Further, positional alignment between the pre-molded cavity and heat sink 190 is improved by the provision of a certain distance D. By way of example, when fixed and/or clamped to the heat sink 190, the covering material 150 may be compressed (i.e. reduced in its vertical dimension) by equal to or more than 5%, 10%, 15%, or 20% of its maximum total vertical dimension (e.g. as measured between the first surface 110*a* of the chip carrier 110 and the first outer surface 150*a* of the covering material 150).

Figure 2:
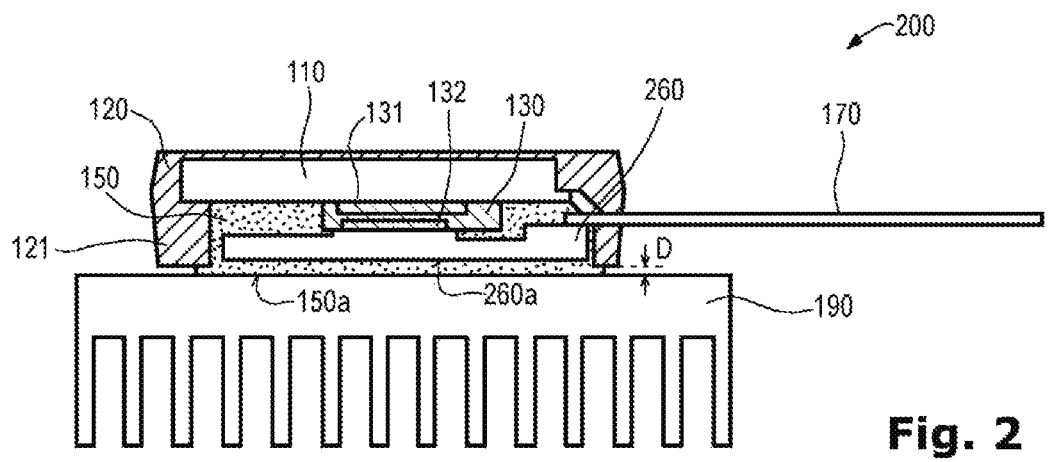
FIG. 2 schematically illustrates a cross-sectional view of an exemplary leaded semiconductor power package including a soft covering material embedding the power semiconductor chip.

FIG. 2 illustrates an exemplary semiconductor power package 200. The semiconductor power package 200 (e.g. with assembled heat sink 190 as shown in FIG. 2) may be similar or identical to the semiconductor power package 100, except that a clip 260 is used as an electrical connection element rather than wire bonds 160 as exemplified in FIG. 1. All other features, properties and results may be identical to what has been described in conjunction with FIG. 1, and reference is made to the above description in order to avoid reiteration.

Analogous to the wire bonds 160, the clip 260 may be completely encased and/or enveloped by the covering material 150. In particular, the covering material 150 may form a first outer surface 150*a* which completely and continuously covers a surface 260*a* of the clip 260 facing away from the electrically conducting chip carrier 110.

As illustrated in FIG. 2, the clip 260 may have one or two lateral dimensions which are close to the lateral dimensions of the cavity 122, i.e. the distance between opposite side walls 121 thereof. That way, the clip 260 may serve as a heat spreader configured to effectively distribute the heat generated by the power semiconductor chip 130 over a major lateral area of the cavity 122. By way of example, the area size of the surface 260*a* of the clip 260 facing away from the electrically conducting chip carrier 110 may be equal to or greater than 50%, 60%, 70%, 80%, 90%, or 95% of an area size defined by the opening of the cavity 122.

Figure 3:
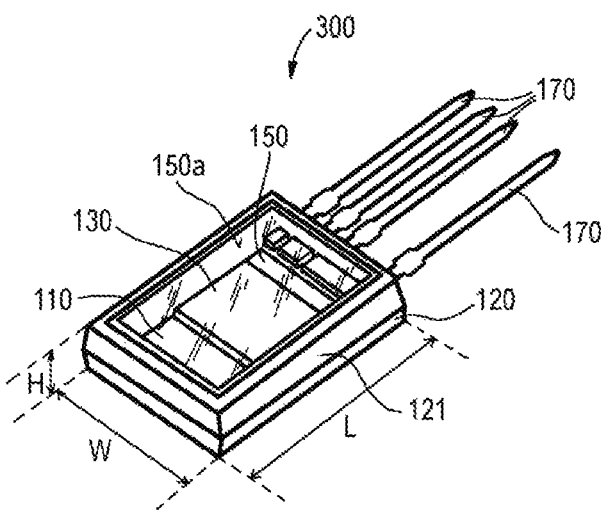
FIG. 3 schematically illustrates a perspective top view of an exemplary leaded semiconductor power package including a soft covering material embedding the power semiconductor chip.

FIG. 3 illustrates a top perspective view of a semiconductor power package 300, e.g. semiconductor power package 100 or semiconductor power package 200. The (optional) connection element (wire bond 160, clip 260) is omitted for ease of illustration. FIG. 3 illustrates by way of example that the first outer surface 150a may have an area size of almost the area size or footprint of the semiconductor power package 300.

Here and in all other examples, the semiconductor power package may have lateral dimensions (length L, width W) of equal to or greater than or less than 5 mm, 10 mm, 20 mm, 30 mm, 40 mm, 50 mm, 60 mm, 70 mm, 80 mm, 90 mm, or 100 mm. The semiconductor power package 300 may, e.g., have a height H of 0.5 mm, 1 mm, 3 mm, 5 mm, 7 mm, 9 mm, or 11 mm.

The first outer surface 150a of the covering material 150 may be extremely flat. The higher the evenness or flatness of the first outer surface 150a, the smaller is the thermal resistance which can be achieved when coupling this first outer surface 150a to a (flat) surface of the heat sink 190. In fact, it is possible to avoid the application of any additional substance such as, for instance, thermal grease or thermal foils, which are conventionally used to couple a package surface two a heat sink 190.

In other words, the semiconductor power package 300 (and all other packages disclosed herein) may be employed as a "plug and play" package which can be directly incorporated in a device or application without any additional preparation needed to enhance the thermal interface properties and to electrically insulate the electrical connection element such as, e.g., the wire bond 160 or the clip 260.

Figure 4:
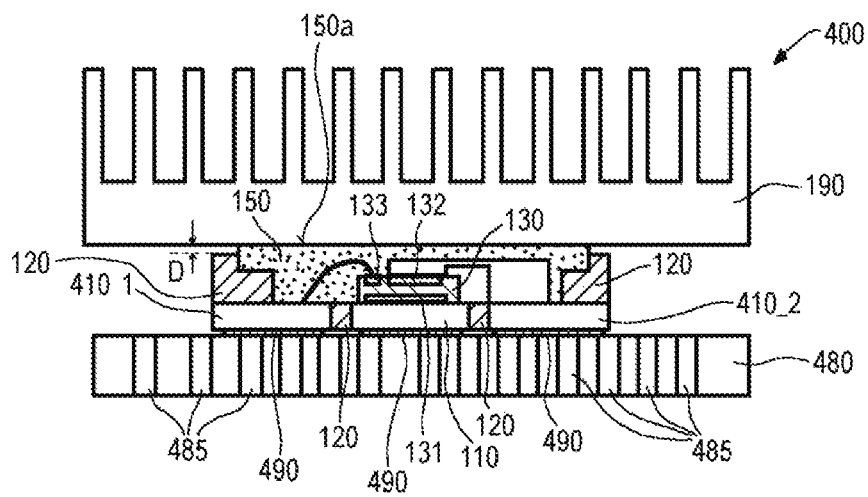
FIG. 4 schematically illustrates a cross-sectional view of an exemplary leadless semiconductor power package including a soft covering material embedding the power semiconductor chip.

FIG. 4 illustrates an exemplary leadless semiconductor power package 400. Semiconductor power package 400 is designed as a SMD. Again, a pre-molded chip housing 120 is used in which an electrically conducting chip carrier (chip pad) 110 and further carrier pads 410_1, 410_2 are cast-in-place. The electrically conducting chip carrier 110 and the further carrier pads 410_1, 410_2 may form a leadless package carrier designed to be used in leadless semiconductor power packages such as, e.g., semiconductor power package 400. The external terminals of the semiconductor power package 400 may all be distributed over the footprint of the semiconductor power package 400. By way of example, the electrically conducting chip carrier 110 and the further carrier pads 410_1, 410_2 may form, inter alia, external terminals of the semiconductor power package 400.

The semiconductor power package 400 may be mounted on a mounting platform or application board such as, e.g., a PCB (Printed Circuit Board) 480. As shown in FIG. 4, bond layers 490, e.g. solder bond layers, may be used to mount the semiconductor power package 400 on the PCB 480, thereby connecting the external package terminals (e.g. the conducting chip carrier 110 and the further carrier pads 410_1, 410_2) with metallic elements 485 of the PCB 480. Internal wiring of the semiconductor power package may comprise wire bond(s) and/or clip(s) or other electrically conductive element(s) as previously described. Further, all other features, dimensions, properties or results of the semiconductor power package 400 may be similar or identical to the corresponding features, dimensions, properties or results described herein in relation to other exemplary packages, and reference is made to the corresponding disclosure herein in order to avoid reiteration.

Figure 5:
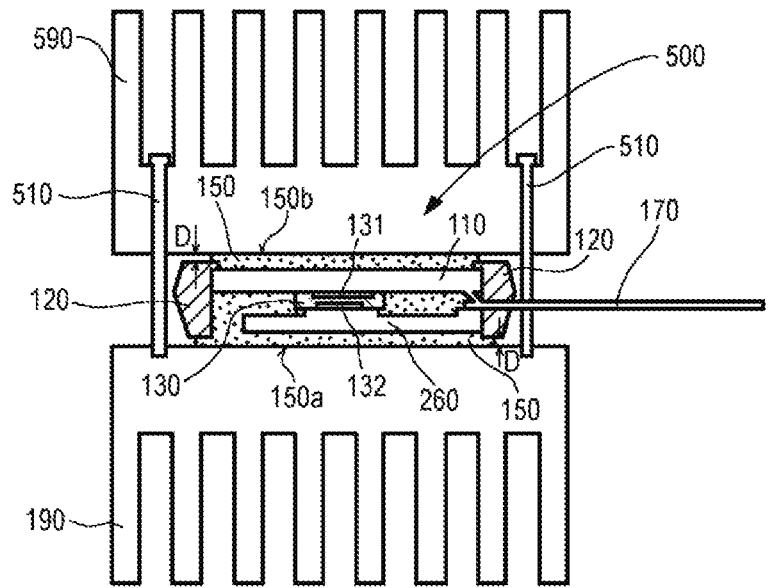
FIG. 5 schematically illustrates a cross-sectional view of an exemplary semiconductor power package configured to be coupled to two heat sinks.

FIG. 5 illustrates an exemplary semiconductor power package 500. Semiconductor power package 500 may be designed similar or identical to semiconductor power packages 100-400 except that the covering material 150 has a second outer surface 150b forming an (additional) exposed surface of the semiconductor power package 500. Semiconductor power package 500 is thus configured to be coupled to heat sinks located at both main sides of the package. Such packages are referred to as DSC (double side cooling) packages in the art. More specifically, the semiconductor power package 500 comprises a pre-molded chip housing 120 having frame-like side walls 121 and two main package faces which are both at least partly formed by outer surfaces 150a, 150b of the covering material 150. All features such as, for instance, dimensions etc., described in relation with the first outer surface 150a and/or the rim of the frame-like side walls 121 of for the cavity 122 may equally apply to the second outer surface 150b and/or the corresponding parts of the pre-molded chip housing 120.

The power semiconductor package 500 may be coupled to two heat sinks 190, 590. More specifically, the two heat sinks 190, 590 may be arranged so as to sandwich the chip housing 120. Thereby, each of both heat sinks 190, 590 may have a mounting surface which may directly contact to the respective first and second outer surfaces 150a, 150b of the covering material 150.

Pressure may be applied to improve the thermal conductivity of the respective heat sink-to-package interfaces. Again, as described previously, no additional substances or auxiliary means need to be applied to improve the thermal conductivity of these interfaces.

The implementation illustrated in FIG. 5 may be termed a press-pack device. That is, the first and second heat sinks 190, 590 may be pressed together by a clamping means 510. The clamping means 510 may be implemented, for instance, by screw joints, springs, etc.

A semiconductor power package 500 having covering material surfaces 150a, 150b at both main faces may have optimum heat removable ability. Both, the clip 260 and the chip carrier 110 may serve as heat spreaders and may be separated from the corresponding heat sinks 190, 590 only by thin layers of covering material 150 of high thermal conductivity and/or small elastic modulus.

In case of a failure of the power semiconductor chip 130, the semiconductor power package 500 illustrated in FIG. 5 may guarantee the creation of a shortage between the load electrodes of the power semiconductor chip 130, e.g. between the collector and the emitter of an IGBT. The time constant for creating the shortage in case of failure may be very short, e.g. a few microseconds. The creation of a shortage in case of power semiconductor chip failure may be beneficial for semiconductor power packages 500 used in serial connection applications. In this case, the failure of one or a few semiconductor power packages in a serial circuitry can often be tolerated if the failure reliably results in an instantaneous shortage of the faulty package.

It is to be noted that the covering material 150 in all examples disclosed herein may be an electrically insulating material. In this case the covering material 150 is not used to provide electrical contact to the power semiconductor chip 130 incorporated in the semiconductor power package 100-500. However, in other examples, it is also possible that an electrically conducting covering material 150 may be used. In this case, it could be possible to electrically connect to load electrodes of the power semiconductor chip 130 via terminals provided by the first and/or second outer surface 150a, 150b of the covering material 150.

Figure 6:
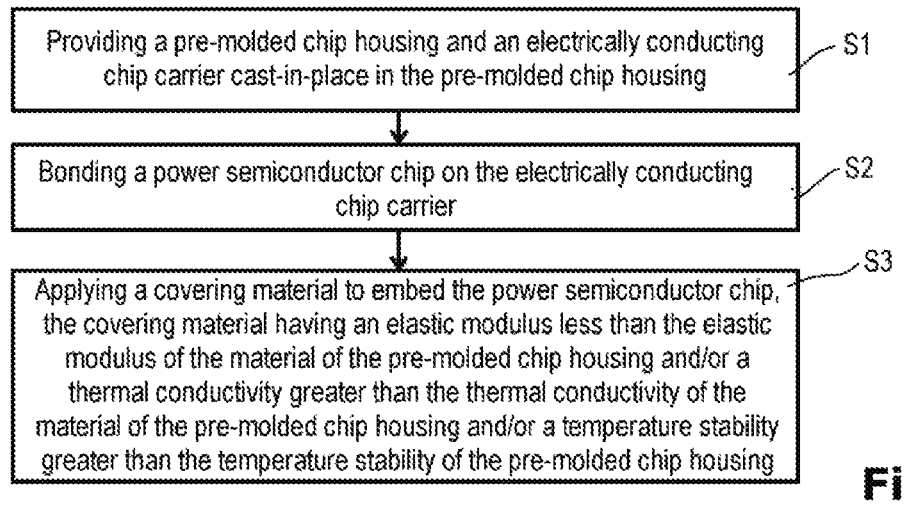
FIG. 6 is a flowchart of an exemplary process for manufacturing a semiconductor power package.

FIG. 6 illustrates a flowchart of an exemplary method of manufacturing a semiconductor power package as described herein. The method may comprise, at S1, providing a pre-molded chip housing having a cavity and an electrically conducting chip carrier cast-in-place in the pre-molded chip housing. This process, which may, e.g., also be called "leadframe molding", may be performed by transfer molding of a leadframe using, e.g., an epoxy-based molding material. Leadframes molded in place in a pre-molded chip housing are also known as so-called "epoxy moldframes". The expression "pre-molding", as used herein, means molding before die attach.

At S2, a power semiconductor chip is bonded over or on the electrically conducting chip carrier, wherein the power semiconductor chip is accommodated in a cavity of the pre-molded chip housing. Die attach may be performed at low temperatures equal to or less than 250° C. by techniques as exemplarily described above.

Depending on the type of the power semiconductor chip, processes such as wire bonding, clip bonding or other connecting processes are performed in order to complete the electrical interconnect of the semiconductor power package. It is also possible that the electrical interconnect of the semiconductor power package is already completed by the die attach process at S2, i.e. that no front side wiring is necessary.

Then, at S3, a covering material is applied to embed the power semiconductor chip (and, for example, the electric connection element), wherein the covering material has an elastic modulus less than the elastic modulus of the material of the pre-molded chip housing. This process may be performed by compression molding, as will be exemplified in more detail further below.

The method of manufacturing the semiconductor power package may comprise subsequent manufacturing processes such as, for example, plating or ball attach, singulation, testing, packaging, etc.

Figure 7:
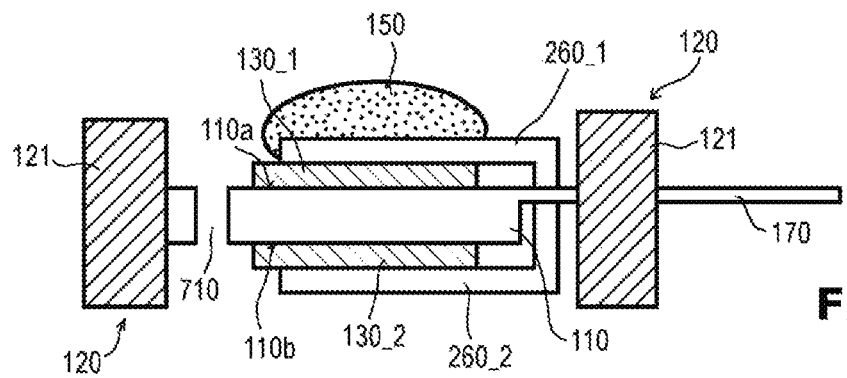
FIG. 7 schematically illustrates a cross-sectional view of a manufacturing method step of an exemplary semiconductor power package before molding.
Figure 8:
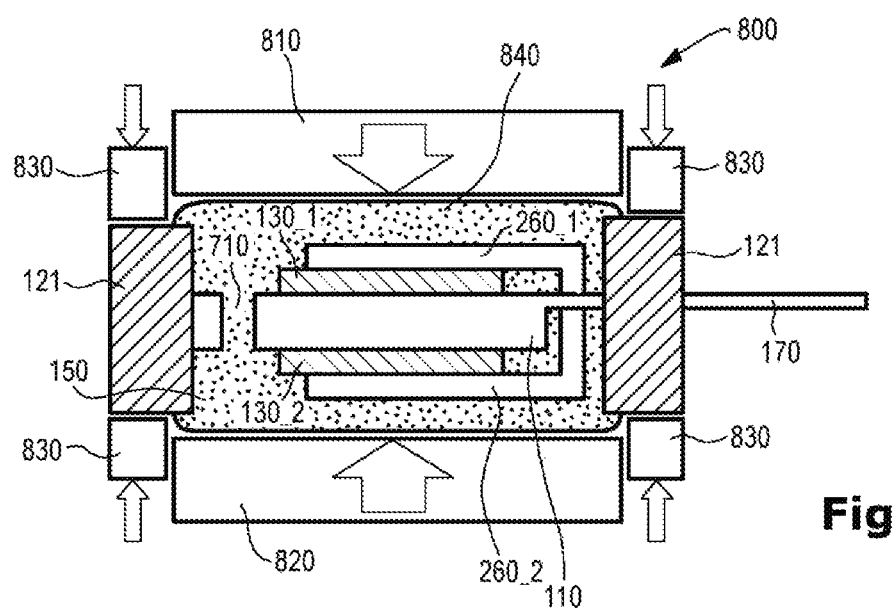
FIG. 8 schematically illustrates a cross-sectional view of a manufacturing method step of an exemplary semiconductor power package during molding.
Figure 9:
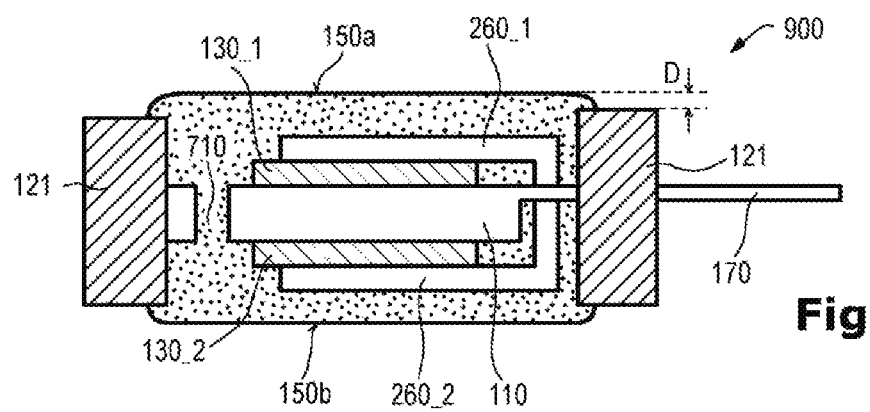
FIG. 9 schematically illustrates a cross-sectional view of a manufacturing method step of an exemplary semiconductor power package after molding.

FIGS. 7 to 9 schematically illustrate cross-sectional views of manufacturing steps to fabricate an exemplary semiconductor power package 900 (see FIG. 9), which is a multi-chip package. The method exemplified by FIGS. 7 to 9 and, especially, the compression molding step exemplified by FIG. 8, is applicable to all semiconductor power packages 100-500 described above. In particular, as the semiconductor power package 900 is a power package configured to be coupled to heat sinks at both package sides (i.e. is a DSC package), the process illustrated in FIGS. 7 to 9 is applicable for manufacturing, e.g., semiconductor power package 500, which is also designed to be coupled to two heat sinks 190, 590.

Referring to FIG. 7, a pre-molded chip housing 120 and an electrically conducting chip carrier 110 cast-in-place into the pre-molded chip housing 120 is provided. In the example shown in FIG. 7, the pre-molded chip housing 120 is shaped as a frame, i.e. it may be designed to only include the frame-like side walls 121. The cavity 122, in this case, corresponds to the space surrounded by the frame-like side walls 121.

A first power semiconductor chip 130_1 is bonded on the first surface 110a of the electrically conducting chip carrier 110 and optionally, a second power semiconductor chip 130_2 may, for example, be bonded on the second surface 110b of the electrically conducting chip carrier 110. In this case, it is possible that the first power semiconductor chip 130_1 and the second power semiconductor chip 130_2 are connected in parallel. By way of example, both of the first power semiconductor chip 130_1 and the second power semiconductor chip 130_2 may be switches, e.g. IGBTs. In another example, one of the first power semiconductor chip 130_1 and the second power semiconductor chip 130_2 may be a switch (e.g. IGBT) and the other of the first power semiconductor chip 130_1 and the second power semiconductor chip 130_2 may be a diode (e.g. free-wheeling diode).

In the example illustrated in FIG. 7, additional (optional) package interconnect is provided by a first clip 260_1 connecting to an electrode, e.g. load electrode, on the top side of the first power semiconductor chip 130_1 and by a second clip 260_2 connecting to an electrode, e.g. load electrode, on the top side of the second power semiconductor chip 130_2. However, as previously mentioned, other types of package interconnect such as, for example, wire bonds 160 may be possible. Further, the absence of any additional package interconnect is also possible, e.g. if horizontal power semiconductor chips 130_1, 130_2 are used.

The electrically conducting chip carrier 110 may comprise a through-hole 710. As shown in FIG. 7, covering material 150 in a liquid or plastic form is disposed over the electrically conducting chip carrier 110 and, for instance, also over the (first) power semiconductor chip 130_1 and/or a connection element forming the further package interconnect, for example the (first) clip 260_1.

Thereafter, as illustrated in FIG. 8, the arrangement shown in FIG. 7 is introduced into a compression molding tool 800. The compression molding tool 800 may comprise a top cavity mold half 810, a bottom cavity mold half 820, and spring-loaded chip housing clamp rings 830.

In operation, the chip housing clamp rings 830 are closed to seal the mold cavity 840. Then, the top cavity mold half 810 and the bottom cavity mold half 820 are moved under pressure in direction towards each other (see arrows). The application of pressure may be accompanied by the application of heat. During the compression molding process, the liquid covering material 150 is distributed throughout the entire mold cavity. The through-hole 710 in the electrically conducting chip carrier 110 (e.g. a leadframe) may serve as a passage of the covering material 150 during the compression molding process.

FIG. 9 illustrates the semiconductor power package 900 produced by, e.g., method steps as illustrated in FIGS. 7 and 8. In this example, both main sides of the semiconductor power package 900 are completely formed by exposed surfaces 150a, 150b of the covering material 150. That is, the semiconductor power package 900 has a first outer surface 150a of covering material 150 and has a second outer surface 150b of covering material 150. As explained above, one or both of these surfaces 150a and/or 150b may be elevated by a distance D over the rim of the frame-like side walls 121 of the pre-molded chip housing 120. The compression molding process is capable of creating highly even first and second outer surfaces 150a, 150b of the covering material 150.

Figure 10:
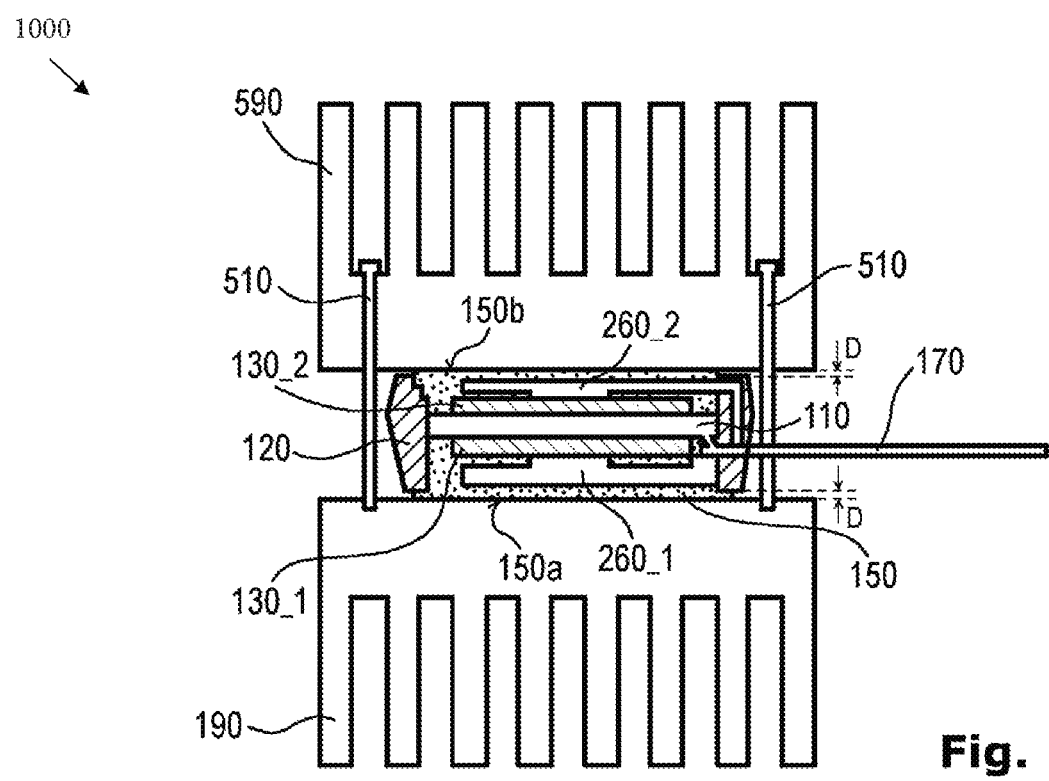
FIG. 10 schematically illustrates a cross-sectional view of an exemplary semiconductor power package configured to be coupled to two heat sinks.

FIG. 10 illustrates by way of example an arrangement in which a semiconductor power package 1000, which is, e.g., designed as a DSC package, is coupled to two heat sinks 190, 590. The semiconductor power package 1000 may, e.g., be designed as illustrated in FIG. 10, or may, e.g., be designed similar to semiconductor power package 900.

The heat sinks 190, 590 may be clamped or pressed to the semiconductor power package 1000 without any additional substances (such as, e.g. thermal grease) necessary to enhance thermal conductivity at the package-to-heat sink interface. This provides substantial benefit to the customer in case it is the customer who arranges the semiconductor power package 1000 between the heat sinks 190, 590. Reference is made to the description of FIG. 5 to avoid reiteration.

On the other hand, it is also possible that the package manufacturer attaches the heat sinks 190, 590 to the semiconductor power package 1000, such that the semiconductor power package 1000 already includes the heat sinks 190, 590 when shipped to the customer. This could be realized by a clamping connection as described above. Alternatively or additionally, it is also possible to directly anchor the heat sinks 190, 590 within the covering material 150. In this case, the heat sinks 190, 590 may be equipped with specific anchoring means (not shown) designed to engage with the covering material 150. It is also possible that the heat sinks 190, 590 are introduced as inserts in the compression molding process so that the heat sinks 190, 590 are cast-in-place during molding.

Figure 11:
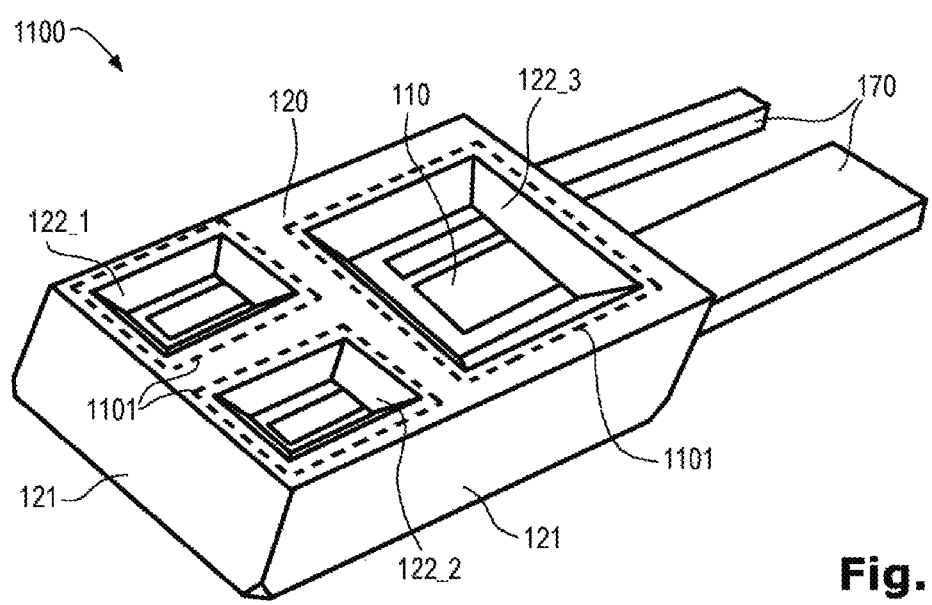
FIG. 11 schematically illustrates a perspective top view of an exemplary semiconductor power module package configured to contain a plurality of power semiconductor chips each to be embedded in a soft covering material.

FIG. 11 illustrates a perspective view of an exemplary semiconductor power package 1100. The semiconductor power package 1100 is similar to the other packages described herein, and reference is made to the disclosure herein in order to avoid reiteration. The semiconductor power package 1100 is designed to contain a plurality of cavities 122_1, 122_2 and 122_3. In each of these cavities 122_1, 122_2 and 122_3, one or a plurality of power semiconductor chips 130 (not shown) may be disposed.

The cavities 122_1, 122_2 and 122_3 formed in the pre-molded chip housing 120 serve to receive the covering material 150. The outlines of the outer surfaces of the covering material 150, when contained in the respective cavities 122_1, 122_2 and 122_3, are labeled by reference sign 1101. As exemplarily illustrated in FIG. 11, it is possible that each portion of covering material 150 contained in one cavity 122_1, 122_2, 121_3 is separated from any other portion of covering material 150 contained in another of the cavities 122_1, 122_2, 122_3. However, it is also possible that the entire top surface of the semiconductor power package 1100 is completely covered by one continuous outer surface of covering material 150. In this case, in contrast to the exemplary illustration of FIG. 11, no insular outer surface portions of covering material 150 (as illustrated by reference sign 1101) are created.

The embodiment shown in FIG. 11 having multiple cavities 122_1, 122_2 and 122_3 allows to apply the (expensive) covering material 150 only at regions where it is needed most, i.e. in the vicinity of the power semiconductor chips 130. Other components, such as, e.g., logic integrated circuits or passive components may be molded into the pre-molded chip housing 120.

Figure 12:
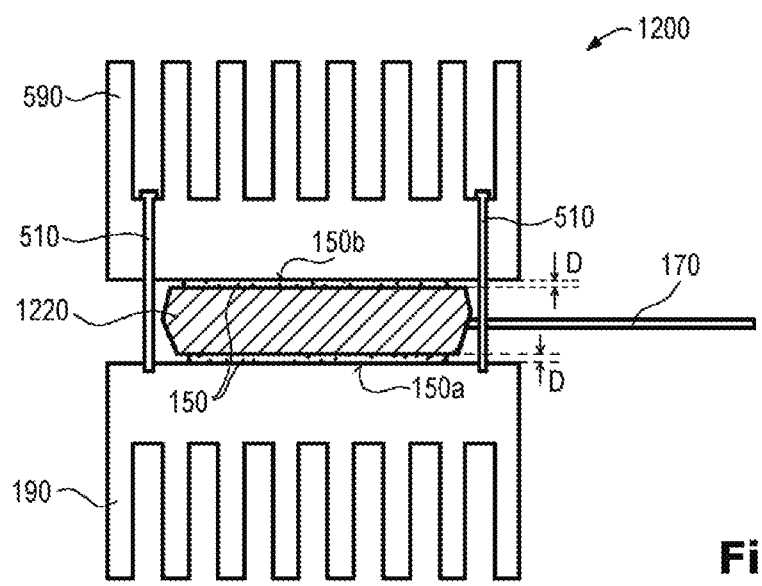
FIG. 12 schematically illustrates a cross-sectional view of an exemplary semiconductor power package coated by a layer of soft covering material.

FIG. 12 schematically illustrates an exemplary semiconductor power package 1200 which is, e.g., designed as a DSC package. The semiconductor power package 1200 comprises an encapsulation 1220 embedding a power semiconductor chip (not shown). The encapsulation 1220 forms a housing of the semiconductor power package 1200. The semiconductor power package 1200 may be a conventionally molded or laminated package, i.e. is the encapsulation material used for forming the encapsulation 1220 may be a material identical to the material of which the chip housing 120 is formed.

However, in contrast to packages described previously, the semiconductor power package 1200 needs not to be formed by a pre-molded chip housing in which the electrically conducting chip carrier is cast-in-place before the power semiconductor chip is bonded on the electrically conducting chip carrier. Rather, the semiconductor power package 1200 may use the conventional concept of firstly mounting the power semiconductor chip to the electrically conducting chip carrier (for example leadframe) and then to apply the encapsulation 1220 by molding or lamination.

Similar to the semiconductor power packages 100 to 500 and 900 to 1100, one or both of the main surfaces of the semiconductor power package 1200 is (are) formed by a layer of covering material 150. That is, a first outer surface 150a of covering material 150 and/or a second outer surface 150b of covering material 150 is (are) provided on the semiconductor power package 1200. All previous disclosure relating to the covering material 150 and the outer surfaces 150a, 150b thereof, in particular including composition, dimensional features, properties etc., are applicable to the semiconductor power package 1200, and reference is made to the description herein to avoid reiteration.

Figure 13:
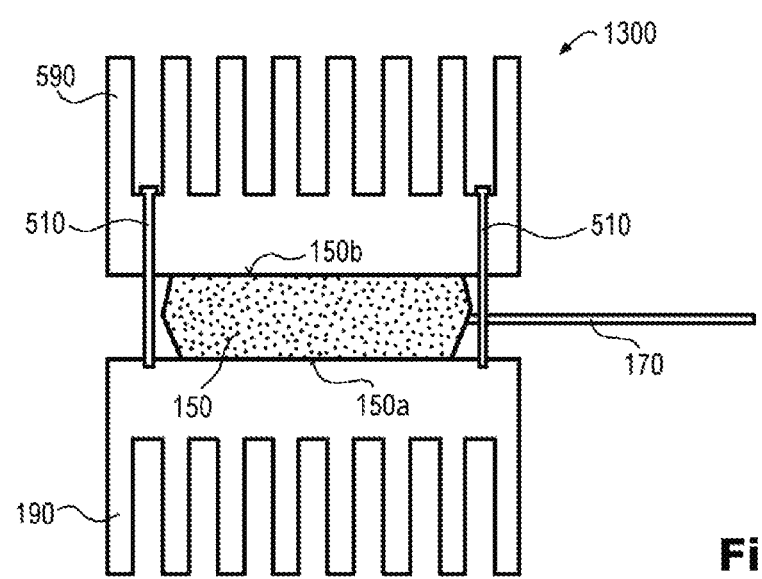
FIG. 13 schematically illustrates a cross-sectional view of an exemplary semiconductor power package having a mold material encapsulation made of a soft encapsulation material.

FIG. 13 illustrates an exemplary semiconductor power package 1300 which is, e.g., designed as a DSC package. The semiconductor power package 1300 uses a mold material encapsulation embedding a power semiconductor chip (not shown), wherein the mold material encapsulation is formed by covering material 150. That is, the compression molding process as, for example, illustrated in FIGS. 7 to 9 is used to form a semiconductor power package 1300 of which the encapsulation and the outer surfaces may completely be formed by covering material. Apparently, the molding process to form the encapsulation of the package 1300 may be performed in the same way as conventional package molding, with the exception that the soft covering material 150 (e.g. filled silicone) is used instead of the hard housing material (e.g. epoxy resin) which is conventionally used for package molding.

Similar to the semiconductor power package 1200, the semiconductor power package 1300 does not need to use a pre-molded chip housing in which an electrically conducting chip carrier is cast-in-placed. Rather, conventional epoxy resin package molding is replaced by package molding using the soft covering material 150.

The semiconductor power package 1300, though being presumably more expensive than other packages described herein, may provide for optimum heat removal capabilities because the entire package encapsulation may be completely formed by bulk covering material 150 having enhanced thermal conductivity and/or thermal capacity and/or providing for first and second outer surfaces 150a, 150b allowing highly efficient heat transfer via these interfaces.

Although specific embodiments have been illustrated and described herein, it will be appreciated by those of ordinary skill in the art that a variety of alternate and/or equivalent implementations may be substituted for the specific embodiments shown and described without departing from the scope of the present invention. By way of example, instead of a contact clip it is also possible to use a contact ribbon. This application is intended to cover any adaptations or variations of the specific embodiments discussed herein.

What is claimed is:

1. A method of manufacturing a semiconductor power package, the method comprising:
   embedding a power semiconductor chip in an encapsulation, the encapsulation forming a housing of the semiconductor power package;
   extending a layer of a covering material over at least a part of an outer main surface of the encapsulation;
   bonding the power semiconductor chip on a first surface of an electrically conducting chip carrier; and
   bonding a second power semiconductor chip on a second surface of the electrically conducting chip carrier opposite the first surface.

2. The method of claim 1, further comprising applying the covering material by compression molding.

3. The method of claim 1, further comprising applying the covering material by transfer molding.

4. The method of claim 1, further comprising applying the covering material by transfer and compression molding.

5. The method of claim 1, further comprising applying the covering material by film-assisted molding.

6. The method of claim 1,
wherein the covering material has a thermal conductivity greater than a thermal conductivity of the material of the encapsulation.

7. The method of claim 1, wherein the power semiconductor chip and the second power semiconductor chip are connected in parallel.

8. The method of claim 1, further comprising:
connecting a first clip to an electrode of the power semiconductor chip; and
connecting a second clip to an electrode of the second power semiconductor chip.

9. The method of claim 1, further comprising disposing a heat sink over an outer surface of the semiconductor power package so that a mounting surface of the heat sink directly contacts the outer surface.

10. The method of claim 9, wherein disposing the heat sink over the outer surface of the semiconductor power package so that the mounting surface of the heat sink directly contacts the outer surface comprises clamping or pressing the heat sink to the outer surface without any additional substances for enhancing thermal conductivity at an interface between the semiconductor power package and the heat sink.

11. A method of manufacturing a semiconductor power package, the method comprising:
embedding a power semiconductor chip in an encapsulation, the encapsulation forming a housing of the semiconductor power package;
bonding the power semiconductor chip on a first surface of an electrically conducting leadframe; and
extending a layer of a covering material over at least a part of an outer main surface of the encapsulation.

12. The method of claim 11, further comprising applying the covering material by compression molding.

13. The method of claim 11, further comprising applying the covering material by transfer molding.

14. The method of claim 11, further comprising applying the covering material by transfer and compression molding.

15. The method of claim 11, further comprising applying the covering material by film-assisted molding.

16. The method of claim 11, further comprising:
bonding a second power semiconductor chip on a second surface of the electrically conducting leadframe opposite the first surface.

17. The method of claim 16, wherein the power semiconductor chip and the second power semiconductor chip are connected in parallel.

18. The method of claim 16, further comprising:
connecting a first clip to an electrode of the power semiconductor chip; and
connecting a second clip to an electrode of the second power semiconductor chip.

19. The method of claim 11, further comprising disposing a heat sink over an outer surface of the semiconductor power package so that a mounting surface of the heat sink directly contacts the outer surface.

20. The method of claim 19, wherein disposing the heat sink over the outer surface of the semiconductor power package so that the mounting surface of the heat sink directly contacts the outer surface comprises clamping or pressing the heat sink to the outer surface without any additional substances for enhancing thermal conductivity at an interface between the semiconductor power package and the heat sink.

21. The method of claim 11, wherein the covering material has a temperature stability greater than a temperature stability of the pre-molded chip housing.

* * * * *